US006707339B1

(12) United States Patent
Kase et al.

(10) Patent No.: US 6,707,339 B1
(45) Date of Patent: Mar. 16, 2004

(54) CONTROLLED BIAS CURRENT BUFFER AND METHOD THEREOF

(75) Inventors: Kiyoshi Kase, Austin, TX (US); Joseph Y. Chan, Gurnee, IL (US); Chunhe Zhao, Austin, TX (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 10/301,992

(22) Filed: Nov. 22, 2002

(51) Int. Cl.[7] .................................................. H03F 3/45
(52) U.S. Cl. ........................ 330/255; 330/260; 330/261
(58) Field of Search ................................ 330/255, 260, 330/261

(56) References Cited

U.S. PATENT DOCUMENTS

| | | | | |
|---|---|---|---|---|
| 4,489,282 A | | 12/1984 | Jett, Jr. | |
| 5,130,635 A | | 7/1992 | Kase | |
| 6,066,976 A | * | 5/2000 | Cho | 327/350 |
| 6,150,802 A | * | 11/2000 | Andrews | 323/282 |
| 6,204,654 B1 | * | 3/2001 | Miranda et al. | 323/316 |

OTHER PUBLICATIONS

Leung, Ka Nang et al., "Three–Stage Large Capacative Load Amplifier with Damping–Factor–Control Frequency Compensation," *IEEE Transactions on Solid–State Circuits*, Feb. 2000, pp. 221–230, vol. 35, No. 2.

* cited by examiner

*Primary Examiner*—Patricia Nguyen
(74) *Attorney, Agent, or Firm*—Robert L. King

(57) ABSTRACT

An operational amplifier circuit (10) uses a first operational amplifier (16) to selectively provide a boosted drive current in response to an input signal voltage transitioning. The boosted driver current is used by a second operational amplifier (22) having a single high gain stage (76). The output drive current of the operational amplifier circuit (10) is increased to a predetermined maximum value for a predetermined time after an input signal transition in order to source increased current to a capacitive or inductive load only during output signal transitions. Separate current boost circuits (30, 70) in each of the first and second operational amplifiers enable early signal transition detection and ensure continuation of increased current until completion of the signal transition.

10 Claims, 4 Drawing Sheets

CONTROLLED BIAS CURRENT BUFFER AND METHOD THEREOF

FIELD OF THE INVENTION

This invention relates to semiconductor devices, and more particularly to operational amplifier buffers.

BACKGROUND OF THE INVENTION

Operational amplifiers are commonly used in electronic circuitry to perform voltage or current amplification or both. Common design criteria where operational amplifiers are used include the need for low power consumption, high slew rate (i.e. speed) and the ability to drive a high capacitive or a highly inductive load. The use of lower power supply voltages makes these design requirements unacceptable using many known operational amplifier designs. For highly capacitive or inductive loads, the feedback loop of an operational amplifier may become unstable in multiple stage operational amplifiers. The capacitive and inductive components create signal phase shifts that cause unacceptable delays associated with signal transitions. Because a single gain stage operational amplifier is stable, a single gain stage design is desirable. However, single gain stage operational amplifier designs have a large power consumption because the transistors must be large to provide adequate current gain in the single gain stage. As a result of the tradeoff between power consumption of a single gain stage operational amplifier required for desired gain and stability issues, multiple gain stage operational amplifiers are typically preferred for applications where low supply voltage and capacitive loads are expected. K. N Leung et al. propose in a paper entitled "Three Stage Large Capacitive Load Amplifier With Damping-Factor-Control Frequency Compensation" in *IEEE Transactions on Solid-State Circuits*, Vol. 35, No. 2, February 2000, pages 221–230, using a three-stage operational amplifier design as a good compromise for these design issues. Leung et al. propose using fixed-value compensation capacitors external to each operational amplifier to provide stability caused by a highly capacitive load. However, the fixed values of these compensation capacitors are designed for a fixed predetermined capacitive loading and do not prevent instability should the load capacitance vary in an application.

BRIEF DESCRIPTION OF THE DRAWINGS

The foregoing and further and more specific objects and advantages of the instant invention will become readily apparent to those skilled in the art from the following detailed description of the invention taken in conjunction with the following drawings.

DETAILED DESCRIPTION OF THE INVENTION

Figure 1:
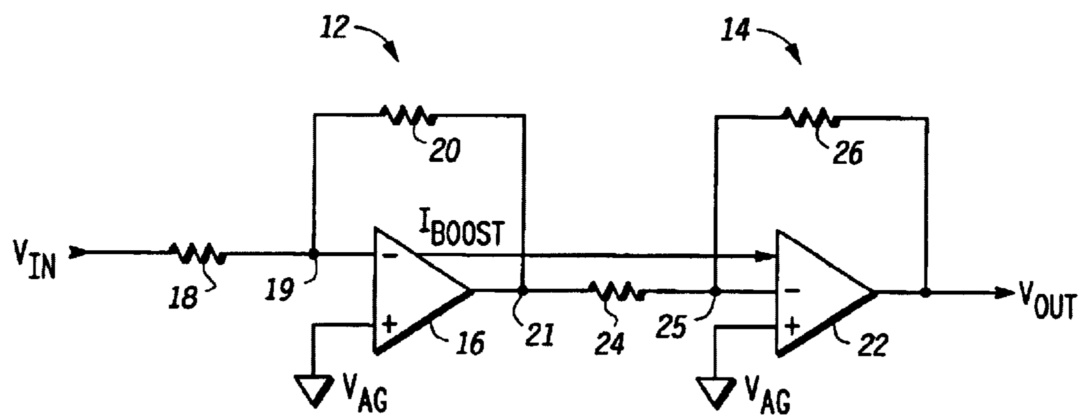
FIG. 1 illustrates in partial schematic form an operational amplifier architecture in accordance with the present invention.

Illustrated in FIG. 1 is an operational amplifier circuit 10 illustrating a buffer design architecture for low supply voltage using voltage rail-to-rail input and output signals for driving an output load expected to have significant reactance, either capacitive, inductive or both. Operational amplifier circuit 10 generally has a first operational amplifier 12 and a second operational amplifier 14. An input signal $V_{IN}$ is connected to a first terminal of a resistor 18. A second terminal of resistor 18 is connected at a node 19 to an inverting input of an operational amplifier 16. A noninverting input of operational amplifier 16 is connected to a reference terminal or an analog ground terminal labeled $V_{AG}$. The analog ground voltage functions as a reference voltage. A first terminal of a resistor 20 is connected to node 19, and a second terminal of resistor 20 is connected to an output of operational amplifier 16 for providing a signal output at a node 21. Within operational amplifier 14 is a resistor 24, a resistor 26 and an operational amplifier 22. A first terminal of resistor 24 is connected to node 21, and a second terminal of resistor 24 is connected to an inverting input of operational amplifier 22 at a node 25. A noninverting input of operational amplifier 22 is connected to an analog ground terminal, $V_{AG}$. A first terminal of resistor 26 is connected to node 25, and a second terminal of resistor 26 is connected to an output of operational amplifier 22 for providing an output voltage, $V_{OUT}$. A current output of operational amplifier 16 is connected to a current input of operational amplifier 22 for providing a current labeled, $I_{BOOST}$.

In operation, assume only for purposes of illustration that resistors 18 and 20 are of equal value and resistors 24 and 26 are of equal value to provide unity voltage gain for each operational amplifier. However, it should be well understood that any amplification factor may be implemented and thus the resistances of resistors 18, 20, 24 and 26 are adjusted accordingly in a conventional manner. Similarly, a device other than resistor may be used within operational amplifier circuit 10 to establish a desired amplification factor. As will be described below, operational amplifier 22 will be implemented as at single stage operational amplifier in order to provide frequency stability even if a load (not shown) expected to be connected to $V_{OUT}$ is highly capacitive or inductive or both capacitive and inductive. Additionally, operational amplifier 22 will be stable even if the output load reactance is varying. However, because operational amplifier 16 is providing a controlled bias current in the form of $I_{BOOST}$, the power that is consumed by operational amplifier 22 is controlled to be maximized immediately upon a change in the input voltage $V_{IN}$ at the input of operational amplifier 16, but reduced to a predetermined minimum once the input and output terminals are at a steady state value. In this manner, the operational amplifier circuit 10 functions to provide the necessary current drive (i.e. current amplification) needed during an input and output signal transition. This functionality results in a fast buffer. Also, since the operational amplifier 22 is a single stage operational amplifier, the operational amplifier circuit 10 is very stable regardless of the type of load that is being driven or the variability of the load. Thus operational amplifier circuit 10 functions to accomplish a variety of essential and desired design parameters involving power consumption, frequency compensation and layout size. Operational amplifier circuit 10 functions for any input voltage transition, not just a rail-to-rail transition (i.e. a full transition between the two power supply voltage terminals). As a result, only enough increased $I_{BOOST}$ current is sourced by operational amplifier 16 that is required to provide a predetermined desired current amplification. The use of only an incremental $I_{BOOST}$ current results in power savings. Because, a two-stage operational amplifier circuit is provided and each operational amplifier is in an inverting configuration, the buffered output signal has a same polarity as the input signal.

Figure 2:
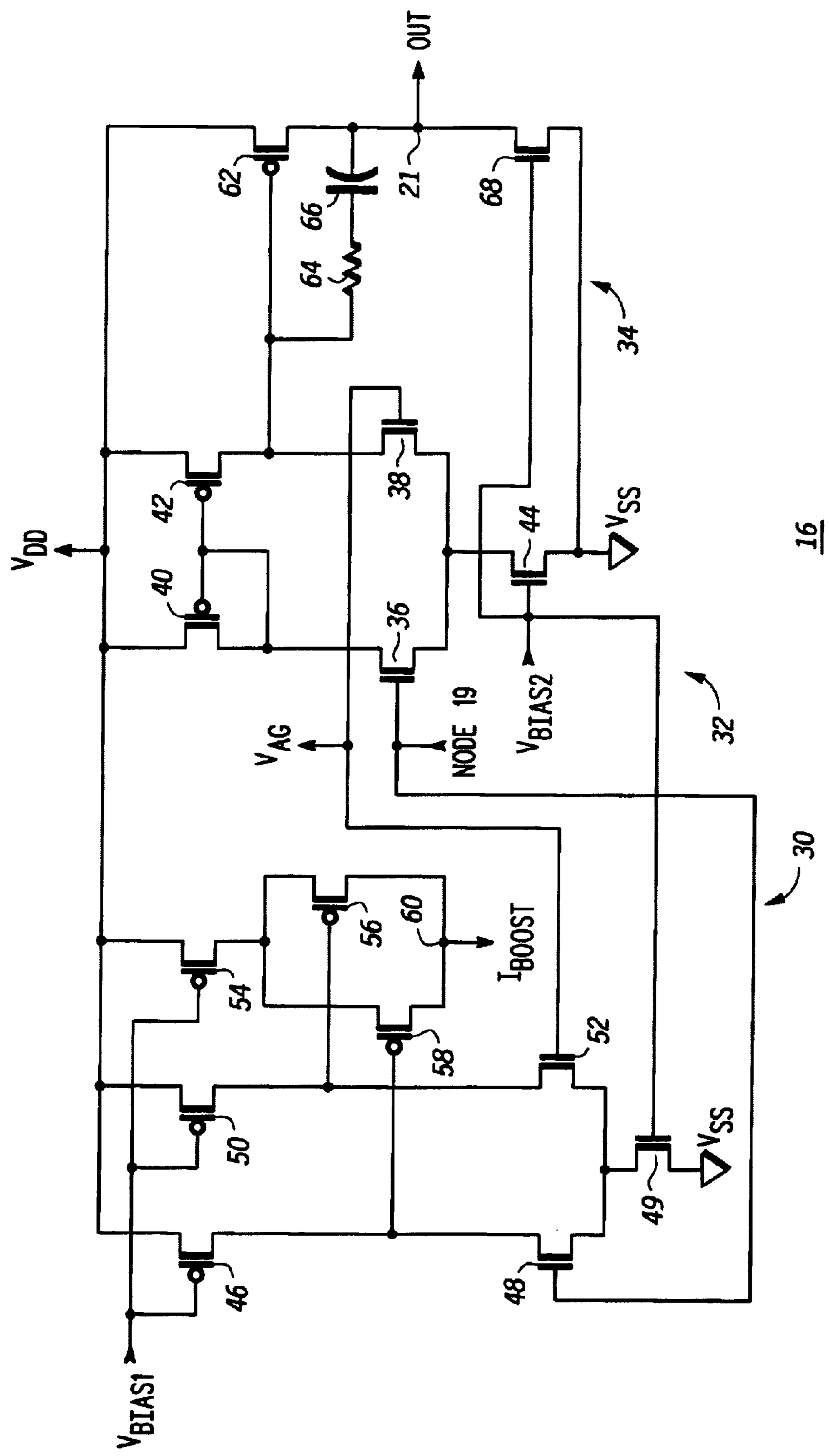
FIG. 2 illustrates in schematic form a first operational amplifier of the operational amplifier architecture of FIG. 1 having two gain stages.

Illustrated in FIG. 2 is a schematic transistor diagram of a two stage Miller compensated operational amplifier 16 from FIG. 1. In the illustrated form, operational amplifier 16 has a current boost stage 30, a first or differential stage 32 and a second or output stage 34. Output stage 34 is the second gain stage and thus operational amplifier 16 is a two-gain stage amplifier. It should be well understood that although two stages, 32 and 34, are illustrated, operational amplifier 16 could be implemented with a single stage or with more than two stages. Capacitor 66 and resistor 64 provide Miller pole-zero frequency compensation for the two stage operational amplifier formed of gain stages 32 and 34. In current boost stage 30, a first conductivity or P-channel transistor 46 has a current electrode or source connected to a power supply voltage terminal labeled $V_{DD}$. In the illustrated form, $V_{DD}$ is understood to be a positive voltage power supply voltage and $V_{SS}$ is a lower potential voltage. For example, the $V_{SS}$ voltage may be a ground potential or a negative potential. Also, the analog ground voltage is understood to be a voltage that has a value approximately one-half between the $V_{SS}$ and $V_{DD}$ potentials. A control electrode or gate of transistor 46 is connected to a first bias voltage labeled $V_{BIAS1}$. A current electrode or drain of transistor 46 is connected to a drain of an N-channel transistor 48. A source of transistor 48 is connected to a drain of an N-channel transistor 49. A source of transistor 49 is connected to a power supply voltage terminal labeled $V_{SS}$. A source of a P-channel transistor 50 is connected to the $V_{DD}$ terminal. A gate of transistor 50 is connected to the first bias voltage, $V_{BIAS1}$, and a drain of transistor 50 is connected to a drain of an N-channel transistor 52. A source of transistor 52 is connected to the drain of transistor 49. A P-channel transistor 54 has a source connected to the $V_{DD}$ terminal, a gate connected to the first bias voltage, $V_{BIAS1}$, and a drain connected to a source of a P-channel transistor 56 and a source of a P-channel transistor 58. A gate of transistor 56 is connected to the drain of transistor 50, and a gate of transistor 58 is connected to the drain of transistor 46. A drain of transistor 56 is connected to the drain of transistor 58 at a node 60 for providing the output current, $I_{BOOST}$. The gate of transistor 52 is connected to a terminal for receiving an analog ground voltage, $V_{AG}$. The gate of transistor 49 is connected to a second bias voltage, $V_{BIAS2}$. The gate of transistor 48 is connected to a terminal for receiving the voltage at node 19.

Differential stage 32 generally has P-channel transistors 40 and 42 and N-channel transistors 36, 38 and 44. P-channel transistor 40 has a source connected to the $V_{DD}$ supply voltage terminal, and has a gate connected to a drain thereof. The drain of transistor 40 is connected to a drain of transistor 36. A gate of transistor 36 is connected to node 19 for receiving the voltage at node 19. A source of transistor 36 is connected to a drain of transistor 44. A gate of transistor 44 is connected to a second bias voltage, $V_{BIAS2}$. Each of the bias voltages $V_{BIAS1}$ and $V_{BIAS2}$ are voltages provided a voltage bias generator (not shown) and are typically less than $V_{DD}$ but more than the transistor threshold voltage. Transistor 42 has a source connected to the $V_{DD}$ terminal, a gate connected to the gate of transistor 40, and a drain connected to a drain of transistor 38. A gate of transistor 38 is connected to the analog ground ($V_{AG}$) voltage terminal, and a source of transistor 38 is connected to a drain of transistor 44.

Output stage 34 has a P-channel transistor 62 having a source connected to the $V_{DD}$ terminal, a gate connected to the drain of transistor 42, and a drain connected to node 21 for providing the output voltage $V_{OUT}$. A first terminal of a resistor 64 is connected to the gate of transistor 62. A second terminal of resistor 64 is connected to a first electrode of a capacitor 66. A second electrode of capacitor 66 is connected to node 21. An N-channel transistor 68 has a drain connected to the drain of transistor 62, a gate connected to the second bias voltage, $V_{BIAS2}$, and a source connected to the $V_{SS}$ voltage terminal.

In operation, in current boost stage 30, transistors 48 and 52 form a differential input pair for detecting a differential in voltage between the inputs $V_{AG}$ and node 19. The voltages at the gates of transistors 56 and 58 respectively form first and second differential output voltages. When there is no or little difference in the input voltages, transistors 56 and 58 are biased off or in a low conduction state. If the voltage at node 19 increases, then transistor 48 becomes conductive and the drain voltage is reduced thereby biasing transistor 58 to become more conductive. In response, the value of $I_{BOOST}$ is increased. If the voltage at node 19 decreases, then the opposite action occurs and transistor 52 is biased to become more conductive. When transistor 52 becomes more conductive, the voltage on the gate of transistor 56 is reduced and therefore transistor 56 becomes more conductive. In response, the value of $I_{BOOST}$ is increased. Therefore, either an increase in the voltage at node 19 or a decrease in the voltage at node 19 with respect to $V_{AG}$ will result in an increase in the current value of $I_{BOOST}$. Additionally, differential stage 32 and output stage 34 function to provide an output voltage at node 21 that is proportional to the difference between $V_{AG}$ and the voltage at node 19. The ratio of the resistances of resistors 18 and 20 determines the amplification factor of this difference at node 21. Differential stage 32 and output stage 34 function in a conventional manner to form this single differential output signal at node 21. Resistor 64 and capacitor 66 are sized in a conventional manner to provide frequency compensation for the operational amplifier 16.

Figure 3:
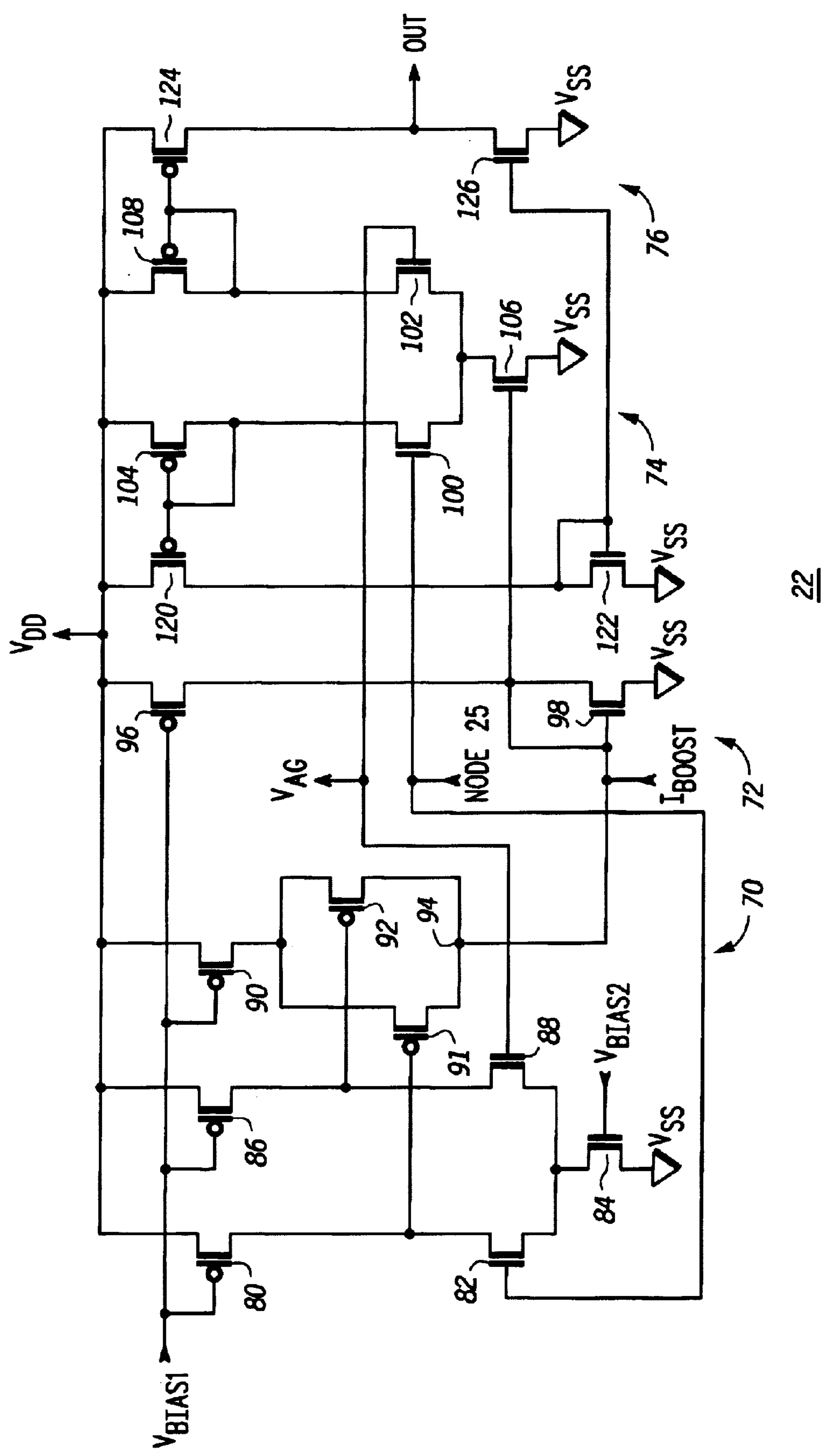
FIG. 3 illustrates in schematic form a second operational amplifier of the operational amplifier architecture of FIG. 1 having a single gain stage.

Illustrated in FIG. 3 is an operational amplifier 22. Operational amplifier 22 generally has a current boost portion 70, a quiescent current portion 72, and an active load current mirror 74 and output portion 76 of the single high gain stage operational amplifier 22. Within current boost portion 70, a P-channel transistor 80 has a source connected to a power supply terminal for receiving power supply voltage $V_{DD}$. A gate of transistor 80 is connected to a first bias voltage, $V_{BIAS1}$, and a drain of transistor 80 is connected to a drain of an N-channel transistor 82. A gate of transistor 82 is connected to the voltage at node 25, and a source of transistor 82 is connected to a drain of an N-channel transistor 84. A gate of transistor 84 is connected to a second bias voltage, $V_{BIAS2}$. A source of transistor 84 is connected to a power supply voltage terminal for receiving $V_{SS}$. A P-channel transistor 86 has a source connected to the $V_{DD}$ terminal, a gate connected to the $V_{BIAS1}$ voltage terminal, and a drain connected to a drain of an N-channel transistor 88. A gate of transistor 88 is connected to a terminal for receiving an analog voltage, $V_{AG}$. A source of transistor 88 is connected to the drain of transistor 84. A P-channel transistor 90 has a source connected to the $V_{DD}$ terminal, a gate connected to the $V_{BIAS1}$ voltage terminal, and a drain connected to a source of both a P-channel transistor 91 and a P-channel transistor 92. A gate of transistor 92 is connected to the drain of transistor 86, and a gate of transistor 91 is connected to the drain of transistor 80. A drain of transistor 91 is connected to a drain of transistor 92 at a node 94 for receiving the current $I_{BOOST}$ from operational amplifier 16.

In minimum current portion 72, a P-channel transistor 96 has a source connected to the $V_{DD}$ power supply voltage terminal, a gate connected to the $V_{BIAS1}$ voltage terminal, and a drain connected to a drain and a gate of an N-channel transistor 98 that is diode-connected. A source of transistor 98 is connected to the $V_{SS}$ power supply voltage terminal. In active load current mirror 74, a P-channel transistor has a source connected to the $V_{DD}$ power supply voltage terminal. A gate and drain of transistor 104 are connected together and connected to a drain of an N-channel transistor 100. A gate of transistor 100 is connected to node 25 for receiving as an input voltage the output of operational amplifier 16. A source of transistor 100 is connected to a drain of an N-channel transistor 106. A gate of transistor 106 is connected to the gate and drain of transistor 98. A source of transistor 106 is connected to the $V_{SS}$ power supply voltage terminal. A P-channel transistor 108 has a source connected to the $V_{DD}$ power supply voltage terminal, and a gate and a drain connected together and to a drain of an N-channel transistor 102. A gate of transistor 102 is connected to the analog ground voltage terminal for receiving $V_{AG}$. A source of transistor 102 is connected to the source of transistor 100 and to a drain of an N-channel transistor 106. A gate of transistor 106 is connected to both the drain and gate of transistor 98. A source of transistor 106 is connected to the $V_{SS}$ power supply voltage terminal. The output portion 76 generally has P-channel transistors 120 and 124 and N-channel transistors 122 and 126. A P-channel transistor 120 has a source connected to the $V_{DD}$ power supply voltage terminal. A gate of transistor 120 is connected to the gate of transistor 104. A drain of transistor 120 is connected to the drain of transistor 122. A gate of transistor 120 is connected to the drain thereof, and a source of transistor 122 is connected to the $V_{SS}$ power supply voltage terminal. Transistor 124 has a source connected to the $V_{DD}$ power supply voltage terminal, a gate connected to the gate of transistor 108, and a drain connected to a drain of transistor 126 for providing the output voltage $V_{OUT}$ of operational amplifier circuit 10. A gate of transistor 126 is connected to the gate of transistor 122, and a source of transistor 126 is connected to the $V_{SS}$ power supply voltage terminal.

In operation, current boost stage 70 functions in a manner similar to current boost stage 30 of FIG. 2. Transistors 82 and 88 form a differential input pair for detecting a differential in voltage between the inputs $V_{AG}$ and the voltage at node 25. The voltages at the gates of transistors 92 and 91 respectively form first and second differential output voltages. When there is no or little difference in the input voltages, transistors 92 and 91 are biased off or in a low conduction state. If the voltage at node 25 increases, then transistor 82 becomes conductive and the drain voltage is reduced thereby biasing transistor 91 to become more conductive. In response, the value of $I_{BOOST}$ is increased. If the voltage at node 25 decreases, then the opposite action occurs and transistor 88 is biased to become more conductive. When transistor 88 becomes more conductive, the voltage on the gate of transistor 92 is reduced and therefore transistor 92 becomes more conductive. In response, the value of $I_{BOOST}$ is increased. Therefore, either an increase in the voltage at node 25 or a decrease in the voltage at node 25 with respect to $V_{AG}$ will result in an increase in the current value of $I_{BOOST}$.

The bias voltage $V_{BIAS1}$ is a value that makes transistor 96 continuously conductive. Transistor 98 is always biased to be conductive at some amount and that amount varies as $I_{BOOST}$ varies. Therefore, regardless of the amount of current provided by the current boost stage 70, transistors 96 and 98 function to guarantee that a minimum amount of current will be continuously mirrored into the active load current mirror 74. The series current conducted by transistors 96 and 98 is mirrored as a result of transistor 98 being diode-connected and a proportional current is conducted by transistor 106. Transistors 100 and 102 form a differential pair and are conductive depending upon the variation of node 25 from the reference analog ground $V_{AG}$. The voltage at node 25 will either increase above or below $V_{AG}$. As the voltage at node 25 rises above $V_{AG}$, transistor 100 is made more conductive than transistor 102 and increases the current through transistor 104. The current conducted by transistor 104 is mirrored to 120 since transistor 104 is diode-connected. The current through transistor 120 makes transistor 122 conductive and that current is proportionately reflected to transistor 126. As transistor 126 is made more conductive, the output voltage $V_{OUT}$ will decrease and approach $V_{SS}$. Similarly, as the voltage at node 25 decreases below $V_{AG}$, transistor 102 is made more conductive than transistor 100 and increases the current through transistor 108. The current conducted by transistor 108 is mirrored to transistor 124 that makes transistor 124 more conductive, thereby raising the voltage potential of $V_{OUT}$.

Figure 4:
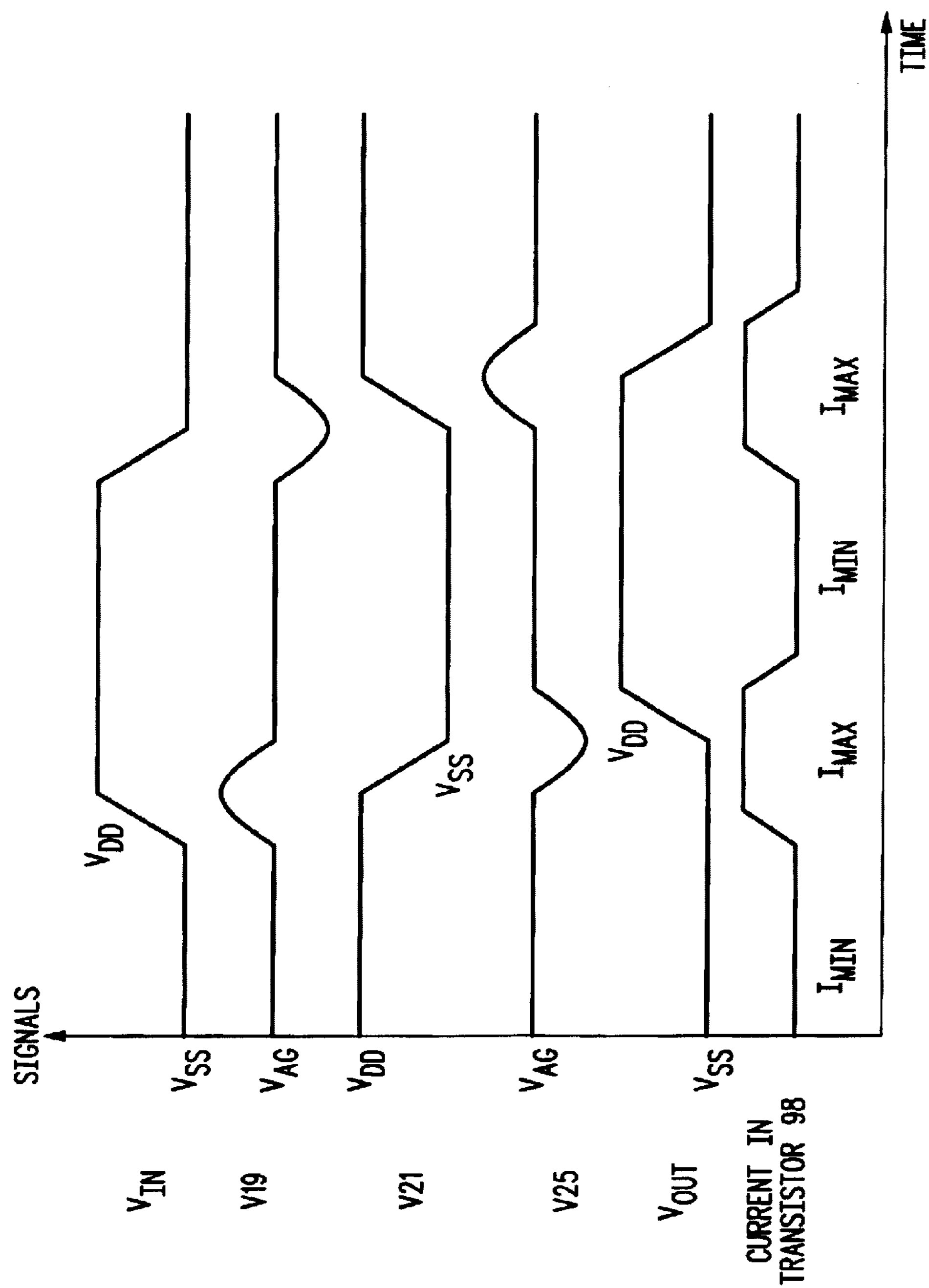
FIG. 4 illustrates in timing diagram form waveforms associated with the operational amplifier architecture of FIG. 1.

Illustrated in FIG. 4 is a timing diagram for further illustrating the operation of operational amplifier circuit 10. Assume that an input signal $V_{IN}$ transitions at some point in time from $V_{SS}$ to $V_{DD}$. In response, the input voltage at node 19, V19, begins to rise and track the input voltage presented on the first terminal of resistor 18. Operational amplifier 16 functions to try to maintain the voltage at node 19 at $V_{AG}$. Because this voltage transition is occurring at the inverting input of operational amplifier 16, the output voltage at node 21, V21, begins to transition to $V_{SS}$ after an amount of time delay. Once the output voltage at node 21 starts to transition to $V_{SS}$, the feedback through resistor 20 causes the voltage at node 19 to return to $V_{AG}$. Also, when the output voltage at node 21 begins to transition, the voltage at node 25, V25, which is on the other side of resistor 24, also starts to decrease. The voltage at node 25 will decrease until the output voltage, $V_{OUT}$, starts to transition from $V_{SS}$ to $V_{DD}$. The positive change in V25 will force the node 25 voltage to return to $V_{AG}$ via the feedback provided by resistor 26. During the initial time when the input voltage is $V_{SS}$, essentially no current is being provided as $I_{BOOST}$. However, the conduction of transistors 96 and 98 ensure that a minimum amount of current, $I_{MIN}$, is flowing which is reflected to the output stage 76 for drive current. However, when the voltage at node 19 rises, the value of $I_{BOOST}$ proportionately increases and current boosting by current boost stage 30 occurs. The operation of current boost stage 30 provides an increase $I_{BOOST}$ that results in the current in transistor 98 transitioning to a maximum value, $I_{MAX}$. When the voltage at node 19 returns to $V_{AG}$, the current boost stage 30 returns the $I_{BOOST}$ current back to approximately zero. However, the current in transistor 98 remains in a maximum value because current boost stage 70 is now operational due to the fact that the voltage at node 25 has transitioned away from $V_{AG}$ and biased transistor 82. The maximum current will continue to flow in transistor 98 and be mirrored into the active load current mirror 74 and output portion 76 until a steady state in the input voltage is reached. In this manner the output portion 76 receives an enhanced drive current every time that the input signal is transitory and additional drive current is provided. The higher current during this particular point of operation is very desirable because when the load is either capacitive or inductive, a signal transition will require a higher drive current. However, it is not desirable that a high current be conducted continuously as that operation would waste power when the input signal is not transitioning.

Similarly, when the input voltage transitions from $V_{DD}$ to $V_{SS}$, the voltage at node 19 decreases from $V_{AG}$ since operational amplifier 16 is an inverting amplifier. The value of V19 will continue to decrease until the output voltage at node 21, V21, transitions from $V_{SS}$ to $V_{DD}$. In response to V19 changing, the current in transistor 98 transitions from a minimum amount to a maximum amount by having current boost stage 30 operate to provide an increased value for $I_{BOOST}$. The maximum current continues after V19 returns to $V_{AG}$ because V25 transitions in response to the change in V19. The change in V25 causes current boost portion 70 to mirror additional current to transistor 98 and keep the current at the maximum value. The increase in V25 forces an inverting change at the output of operational amplifier 22. The change of $V_{OUT}$ to $V_{SS}$ forces, via feedback resistor 26, the V25 voltage to return to $V_{AG}$. Only in response to the output voltage $V_{OUT}$ returning to $V_{SS}$ will the current boost portion 70 become inactive and the current conducted by transistor 98 returns to a minimum value.

By now it should be apparent that a circuit and method has been provided to accurately control current drive in an operational amplifier buffer circuit that is intended to drive a capacitive or inductive load. The circuit and method disclosed herein functions to save power by selectively driving increased current only when a signal transition occurs. Because the operational amplifier that is connected to the output load is a single stage operational amplifier, frequency stability is accomplished and process variation issues are avoided but without incurring a significant power penalty. Because increased current drive is selectively provided to the output, the active load current mirror 74 of operational amplifier 22 reduces the amount of power that would otherwise be consumed if the required drive current were source continuously. Nonetheless, the output signal voltage continues to be able to transition between full rail-to-rail (power supply voltage values) potentials.

The method of controlling output drive current in operational amplifier circuit 10 includes receiving an input signal at a first operational amplifier, operational amplifier 16. A first boost current is provided in response to detecting a transition of signal value of the input signal. A second operational amplifier, operational amplifier 22 is coupled to the first operational amplifier. The second operational amplifier detects the transition of the signal value of the input signal after receiving the first boost current. Output drive current capability of the second operational amplifier is increased in response to the first boost current. A transition of signal value of the input signal at the second operational amplifier is detected. A second boost current within the second operational amplifier is provided in response to detection of the signal value transition. A buffered version of the transition of signal value of the input signal having an increased current drive is provided. The first boost current is removed when a first input of the first operational amplifier has a substantially same voltage potential as a second input thereof. However, the buffered version of the transition of signal value of the input signal is continued to be provided with an increased current drive until a first input of the second operational amplifier has a substantially same voltage potential as a second input thereof.

Various changes and modifications to the embodiments herein chosen for purposes of illustration will readily occur to those skilled in the art. For example, although specific MOS transistors have been illustrated, the present invention may be implemented in any semiconductor process. Conductivities of the transistors shown and values of power supply voltage potentials may be varied. The operational amplifier circuits described herein are not functionality limited by speed of operation and any input signal frequency may be implemented. Various feedback circuits and compensation techniques may be used in connection with operational amplifiers 16 and 22. Instead of implementing resistors 18, 20, 24 and 26 as semiconductor resistors, equivalents such as switched capacitive devices that simulate a resistor may be used. Transistors 46, 50 and 54 of current boost stage 30 each function as current sources that may be implemented by devices other than shown, such as by using a resistor in lieu of a transistor. Similarly, transistors 80, 86 and 90 of current boost stage 70 each function as current sources that may be implemented by devices other than shown. Transistor 49 functions as a current sink device and may be implemented by other devices that function as a current sink. The same is true of transistors 44, 68 and 84. To the extent that such modifications and variations do not depart from the spirit of the invention, they are intended to be included within the scope thereof that is assessed only by a fair interpretation of the following claims.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

We claim:

1. A bias current buffer comprising:

a first device for receiving an input signal;

a first operational amplifier having a first input coupled to the first device, a second input coupled to a reference terminal for receiving a reference voltage, a signal output, and a current drive output, the current drive output providing a boost current in response to detecting a transition of signal value of the input signal and removing the boost current when the first input has a substantially same voltage potential as the second input;

a second device having a first terminal coupled to the signal output of the first operational amplifier and a second terminal coupled to the first input of the first operational amplifier, the second device providing a feedback path for the first operational amplifier;

a third device having a first terminal coupled to the signal output of the first operational amplifier and having a second terminal;

a second operational amplifier having a first input coupled to the second terminal of the third device, a second input coupled to the reference terminal for receiving the reference voltage, a third input for receiving the boost current, and an output for providing an output voltage having an increased current drive during the transition of signal value of the input signal, the increased current drive being reduced to a smaller current drive during a time when the input signal has no signal transitions; and a fourth device having a first terminal coupled to the output of the second operational amplifier and a second terminal coupled to the first input of the second operational amplifier, the fourth device providing a feedback path for the second operational amplifier.

2. The bias current buffer of claim 1 wherein the first device comprises a first resistor having a first terminal for receiving the input signal, and a second terminal connected to the first input of the first operational amplifier, the second device comprises a second resistor having a first terminal connected to the :first input of the first operational amplifier and a second terminal connected to the output of the first operational amplifier, the third device comprises a third resistor having a first terminal connected to the output of the first operational amplifier and a second terminal connected to the first input of the second operational amplifier, and a fourth resistor having a first terminal connected to the first input of the second operational amplifier and a second terminal connected to the output of the second operational amplifier, wherein resistive values of the first resistor, the second resistor, the third resistor and the fourth resistor determine gain factors of the first and second operational amplifiers.

3. The bias current buffer of claim 1 wherein the first operational amplifier further comprises a first current boost circuit having an input coupled to the first input of the first operational amplifier and an output coupled to the current drive output, the first current boost circuit providing the boost current:in response to signal transition of the input signal until the first input of the first operational amplifier is at the reference voltage, and wherein the second operational amplifier further comprises a second current boost circuit having an input coupled to the first input of the second operational amplifier and an output coupled to the third input of the second operational amplifier, the second current boost circuit providing the boost current in response to signal transition at the first input of the second operational amplifier until the first input of the second operational amplifier is at the reference voltage.

4. The bias current buffer of claim 3 wherein the first current boost circuit further comprises:

a first current source having a first terminal coupled to a voltage supply terminal and a second terminal;

a second current source having a first terminal coupled to the voltage supply terminal and a second terminal;

a third current source having a first terminal coupled to the voltage supply terminal and a second terminal;

a first transistor of a first conductivity type having a first current electrode coupled to the second terminal of the first current source, a second current electrode, and a control electrode coupled to the first input of the first operational amplifier;

a second transistor of the first conductivity type having a first current electrode coupled to the second terminal of the second current source, a control electrode coupled to the reference terminal, and a second current electrode coupled to the second current electrode of the first transistor;

a current sink having a first terminal connected to the second current electrode of each of the first transistor and the second transistor and having a second terminal;

a third transistor of a second conductivity type having a first current electrode coupled to the second terminal of the third current source, a control electrode coupled to the second terminal of the first current source, and a second current electrode coupled to the current drive output of the first operational amplifier; and a fourth transistor of the second conductivity type having a first current electrode coupled to the second terminal of the third current source, a control electrode coupled to the second terminal of the second current source, and a second current electrode coupled to the current drive output of the first operational amplifier.

5. A method of controlling output drive current in a buffer circuit comprising:

receiving an input signal at a first operational amplifier;

providing a first boost current in response to detecting a transition of signal value of the input signal;

coupling a second operational amplifier to the first operational amplifier, the second operational amplifier detecting the transition of the signal value of the input signal after receiving the first boost current and increasing output drive current capability of the second operational amplifier in response to the first boost current;

detecting the transition of signal value of the input signal at the second operational amplifier and providing a second boost current within the second operational amplifier in response thereto;

providing a buffered version of the transition of signal value of the input signal having an increased current drive;

removing the first boost current when a first input of the first operational amplifier has a substantially same voltage potential as a second input thereof; and continuing to provide the buffered version of the transition of signal value of the input signal with an increased current drive until a first input of the second operational amplifier has a substantially same voltage potential as a second input thereof.

6. The method of claim 5 further comprising:

providing the first boost current with a first current boost circuit that is responsive to the first and second inputs of the first operational amplifier; and providing the second boost current with a second current boost circuit that is separate and distinct from the first current boost circuit and responsive to the first and second inputs of the second operational amplifier.

7. The method of claim 5 further comprising:

forcing the transition of signal value of the input signal at the first input of the first operational amplifier to a reference voltage potential via a first feedback means coupled between an output of the first operational amplifier and the first input of the first operational amplifier prior to forcing the transition of signal value of the input signal at the first input of the second operational amplifier to the reference voltage potential via a second feedback means coupled between an output of the second operational amplifier and the first input of the second operational amplifier.

8. A circuit comprising:

a first resistor having a first terminal for receiving an input signal and a second terminal;

a first operational amplifier having a first input coupled to the second terminal of the first resistor, a second input coupled to a reference terminal for receiving a reference voltage substantially one-half of a predetermined power supply voltage potential, a signal output, and a current drive output, the current drive output providing a boost current in response to detecting a transition of signal value of the input signal and removing the boost current when the first input has a substantially same voltage potential as the second input;

a second resistor having a first terminal coupled to the signal output of the first operational amplifier and a second terminal coupled to the first input of the first operational amplifier, the second resistor providing a feedback path for the first operational amplifier;

a third resistor having a first terminal coupled to the signal output of the first operational amplifier and having a second terminal;

a second operational amplifier having a first input coupled to the second terminal of the third resistor, a second input coupled to the reference terminal for receiving the reference voltage, a third input for receiving the boost current, and an output for providing an output voltage having an increased current drive during the transition of signal value of the input signal, the increased current drive being reduced to a smaller current drive during a time when the input signal has no signal transitions; and a fourth resistor having a first terminal coupled to the output of the second operational amplifier and a second terminal coupled to the first input of the second operational amplifier, the fourth resistor providing a feedback path for the second operational amplifier.

9. The circuit of claim 8 wherein the first operational amplifier further comprises a first current boost circuit having an input coupled to the first input of the first operational amplifier and an output coupled to the current drive output, the first current boost circuit providing the boost current in response to signal transition of the input signal until the first input of the first operational amplifier is at the reference voltage, and wherein the second operational amplifier further comprises a second current boost circuit having an input coupled to the first input of the second operational amplifier and an output coupled to the third input of the second operational amplifier, the second current boost circuit providing the boost current in response to signal transition at the first input of the second operational amplifier until the first input of the second operational amplifier is at the reference voltage.

10. The circuit of claim 8 wherein the first current boost circuit further comprises:

a first current source having a first terminal coupled to a voltage supply terminal and a second terminal;

a second current source having a first terminal coupled to the voltage supply terminal and a second terminal;

a third current source having a first terminal coupled to the voltage supply terminal and a second terminal;

a first transistor having N-type conductivity and having a first current electrode coupled to the second terminal of the first current source, a second current electrode, and a control electrode coupled to the first input of the first operational amplifier;

a second transistor having N-type conductivity and having a first current electrode coupled to the second terminal of the second current source, a control electrode coupled to the reference terminal, and a second current electrode coupled to the second current electrode of the first transistor;

a current sink having a first terminal connected to the second current electrode of each of the first transistor and the second transistor and having a second terminal;

a third transistor having a P-type conductivity and having a first current electrode coupled to the second terminal of the third current source, a control electrode coupled to the second terminal of the first current source, and a second current electrode coupled to the current drive output of the first operational amplifier; and a fourth transistor having the P-type conductivity and having a first current electrode coupled to the second terminal of the third current source, a control electrode coupled to the second terminal of the second current source, and a second current electrode coupled to the current drive output of the first operational amplifier.

* * * * *